(12) United States Patent
Taguchi et al.

(10) Patent No.: US 8,193,269 B2
(45) Date of Patent: Jun. 5, 2012

(54) SILICONE RESIN COMPOSITION FOR OPTICAL SEMICONDUCTOR DEVICES AND AN OPTICAL SEMICONDUCTOR DEVICE

(75) Inventors: Yusuke Taguchi, Annaka (JP); Kenji Hagiwara, Annaka (JP); Junichi Sawada, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 272 days.

(21) Appl. No.: 12/766,660

(22) Filed: Apr. 23, 2010

(65) Prior Publication Data

US 2010/0273927 A1    Oct. 28, 2010

(30) Foreign Application Priority Data

Apr. 24, 2009 (JP) ................. 2009-107101

(51) Int. Cl.
*C08K 3/22* (2006.01)
(52) U.S. Cl. ........ 524/430; 524/431; 524/433; 524/588; 525/476
(58) Field of Classification Search .................. 524/430, 524/431, 433, 588; 525/476
See application file for complete search history.

(56) References Cited

U.S. PATENT DOCUMENTS

| | | | |
|---|---|---|---|
| 8,012,381 B2* | 9/2011 | Taguchi et al. | 264/1.1 |
| 8,013,056 B2* | 9/2011 | Taguchi et al. | 524/588 |
| 8,013,057 B2* | 9/2011 | Taguchi et al. | 524/588 |
| 8,022,137 B2* | 9/2011 | Taguchi et al. | 524/588 |
| 8,044,128 B2* | 10/2011 | Sawada et al. | 524/147 |
| 8,088,856 B2* | 1/2012 | Shiobara et al. | 524/413 |
| 2008/0057325 A1* | 3/2008 | Sakurai et al. | 428/447 |
| 2009/0306263 A1* | 12/2009 | Taguchi et al. | 524/404 |
| 2010/0001311 A1* | 1/2010 | Taguchi et al. | 257/100 |
| 2010/0081748 A1* | 4/2010 | Taguchi et al. | 524/433 |
| 2010/0125116 A1* | 5/2010 | Shiobara et al. | 524/413 |
| 2011/0054072 A1* | 3/2011 | Sawada et al. | 523/353 |

FOREIGN PATENT DOCUMENTS

| | | |
|---|---|---|
| JP | 2-189958 A | 7/1990 |
| JP | 2005-306952 A | 11/2005 |

* cited by examiner

*Primary Examiner* — Margaret Moore
(74) *Attorney, Agent, or Firm* — Birch, Stewart, Kolasch & Birch, LLP

(57) ABSTRACT

Silicone resin composition for optical semiconductor devices, providing cured product wherein warpage in the devices is reduced and whiteness, heat-resistance, and light resistance are improved. The composition comprises: (A) an organopolysiloxane of the formula $$(CH_3)_a Si(OR^1)_b (OH)_c O_{(4-a-b-c)/2} \quad (1)$$

wherein $R^1$ is monovalent hydrocarbon and a, b, and c are numbers such that: $0.8 \le a \le 1.5$, $0 \le b \le 0.3$, $0.001 \le c \le 0.5$, and $0.801 \le a+b+c < 2$; (B) white pigment; (C) an inorganic filler other than the white pigment; (D) condensation catalyst; (E) an epoxy resin derived from isocyanuric acid; (F) an organopolysiloxane comprising unit $R_2SiO$ and unit $RSiO_{1.5}$, wherein R is hydroxyl, methyl, ethyl, propyl, cyclohexyl, phenyl, vinyl, or allyl; and
(G) a linear diorganopolysiloxane of the formula

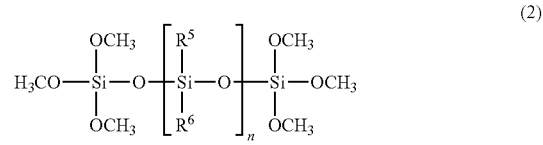

(2)

wherein $R^5$ and $R^6$ are alkyl, cyclohexyl, vinyl, phenyl, or allyl and n is an integer from 800 to 1200.

3 Claims, 1 Drawing Sheet

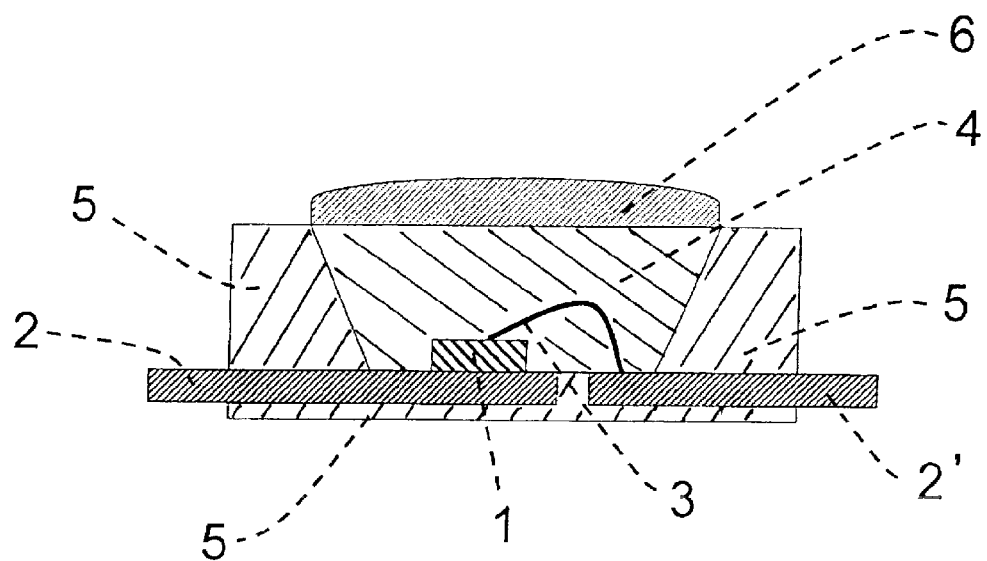

SILICONE RESIN COMPOSITION FOR OPTICAL SEMICONDUCTOR DEVICES AND AN OPTICAL SEMICONDUCTOR DEVICE

CROSS REFERENCE

This application claims the benefits of Japanese Patent Application No. 2009-107101 filed on Apr. 24, 2009, the contents of which are herein incorporated by reference.

FIELD OF THE INVENTION

The present invention relates to a silicone resin composition for optical semiconductor devices, specifically to a silicone resin composition comprising an organopolysiloxane having a silanol group and an organopolysiloxane having a linear diorganopolysiloxane moiety with a particular length, whereby moldability is good and problems, such as warpage of a semiconductor device in curing and discoloration, particularly yellowing, of a cured product due to light degradation, are markedly reduced.

BACKGROUND OF THE INVENTION

Optical semiconductor elements, such as light emitting diodes (LED), are used as indicators or light sources. Recently, their outputs have become higher and their wavelengths have been shorter, which causes a problem that resin materials present near the optical semiconductor elements are degraded due to light to turn yellow, resulting in lower light output.

The following Patent Literature 1 discloses, as a resin composition for encapsulating optical semiconductors, an epoxy resin composition in a B stage which comprises an epoxy resin, a curing agent, and a curing promoter. It describes that bisphenol A epoxy resin or bisphenol F epoxy resin is mainly used as the epoxy resin and triglycidyl isocyanate may be used. However, the afore-mentioned composition has the aforesaid yellowing problem, particularly when an optical semiconductor element is turned on at a high temperature or for a long time.

Patent Literature 2 discloses a composition which comprises an epoxy resin derived from isocyanuric acid, as a heat-resistant and light-resistant epoxy resin composition for encapsulating light emitting elements. However, light resistance of the composition is insufficient, again.

Meanwhile, recently, sizes of molded package have become bigger, for instance, in Matrix Array Package (MAP) method and, therefore, warpage in curing of an encapsulating resin has become a serious problem. Large warpage causes various problems in a package transfer step or a package cutting step. The afore-mentioned compositions are unsatisfactory also in this respect.

Patent Literature 1: Japanese Patent Application Laid-Open Hei-02-189958
Patent Literature 2: Japanese Patent Application Laid-Open 2005-306952

SUMMARY OF THE INVENTION

Problems to be Solved by the Invention

A purpose of the present invention is to provide a silicone resin composition for optical semiconductor devices, which provides a cured product whose warpage in the optical semiconductor device in curing is less and whose whiteness, heat-resistance, and light resistance are better.

Means to Solve the Problems

The present invention is a silicone resin composition, comprising
(A) 100 parts by mass of an organopolysiloxane having a weight average molecular weight of from 500 to 20000, reduced to polystyrene, and represented by the following average compositional formula (1),

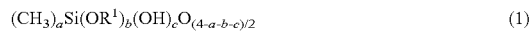

$$(CH_3)_a Si(OR^1)_b (OH)_c O_{(4-a-b-c)/2} \qquad (1)$$

wherein $R^1$ is a monovalent hydrocarbon group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c < 2$,
(B) 3 to 200 parts by mass of a white pigment,
(C) 400 to 1000 parts by mass of an inorganic filler other than the afore-mentioned white pigment,
(D) 0.01 to 10 parts by mass of a condensation catalyst,
(E) 1.0 to 10 parts by mass of an epoxy resin which is a derivative of isocyanuric acid,
(F) 2 to 50 parts by mass of an organopolysiloxane comprising unit $R_2SiO$ and unit $RSiO_{1.5}$, wherein R may be same or different and is a group selected from the group consisting of a hydroxyl group, a methyl group, an ethyl group, a propyl group, a cyclohexyl group, a phenyl group, a vinyl group and an allyl group, wherein at least a part of the afore-mentioned unit $R_2SiO$ repeats itself in series and the number of the repetition is 5 to 100, and wherein 0.5 to 10 mole % of the siloxane units comprising unit $R_2SiO$ and unit $RSiO_{1.5}$ has a silanol group, and
(G) 2 to 50 parts by mass of a linear diorganopolysiloxane represented by the following formula (2).

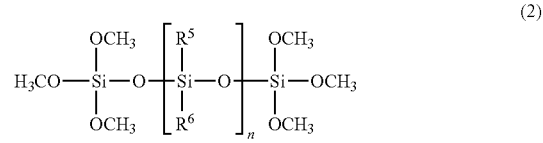

$$\text{(2)}$$

wherein $R^5$ and $R^6$ are, independently of each other, selected from the group consisting of an alkyl group having 1 to 3 carbon atoms, a cyclohexyl group, a phenyl group, a vinyl group, and an allyl group and n is an integer of from 800 to 1200.

EFFECTS OF THE INVENTION

The composition of the present invention does not cause distortion in a device when cured, and can provide a cured product which shows excellent adhesion and an anti-cracking property after repeated heating, and is white, heat resistant and light resistant, on account of the combination of organopolysiloxane (F) which has a linear diorganopolysiloxane moiety having a particular length, an organopolysiloxane (G) having a linear diorganopolysiloxane moiety having a particular length and a methoxy group on the ends, and organopolysiloxane (A) which has the branched structure.

BRIEF DESCRIPTION ON THE DRAWING

FIG. 1 is a cross-sectional view which indicates an example of an optical semiconductor device where the silicone resin composition of the present invention is used.

BEST MODES OF THE INVENTION (A) Organopolysiloxane

Organopolysiloxane (A) has a silanol group and forms a cross linked structure in the presence of condensation catalyst (D). In the afore-mentioned average compositional formula (1), $R^1$ is an alkyl group having 1 to 4 carbon atoms and a, b, and c are numbers which satisfy the equations: $0.8 \leq a \leq 1.5$, $0 \leq b \leq 0.3$, $0.001 \leq c \leq 0.5$, and $0.801 \leq a+b+c < 2$.

A composition which comprises an organopolysiloxane with "a" less than the afore-mentioned lower limit, where "a" represents a content of $CH_3$, is not preferred because such a composition provides too hard a cured product, which may crack. If "a" exceeds the afore-mentioned upper limit, such a resin does not solidify. Preferably, "a" satisfies the equation $0.9 \leq a \leq 1.2$, more preferably $0.9 \leq a \leq 1.1$.

If b, content of $OR^1$, exceeds the afore-mentioned upper limit, the molecular weight is so small that crack resistance may be insufficient. Preferably, b satisfies the equation $0.001 \leq b \leq 0.2$, more preferably $0.01 \leq b \leq 0.1$. The group, $OR^1$, can be quantified in infrared absorption spectra (IR) or alcohol quantification by alkali cracking.

If c, content of an OH group bound to an Si atom, exceeds the afore-mentioned upper limit, such an organopolysiloxane gives, after condensation in thermal curing and/or condensation with component (F), a cured product which has a high stiffness, but shows a poor crack resistance. If c is less than the afore-mentioned lower limit, a melting point of the organopolysiloxane tends to be higher, so that problems may occur in workability. If no bond is formed with component (F) and (G), components (F) and (G) are not fixed in a cured product, so that stiffness of the cured product tends to be lower and solvent resistance tends to be bad. Preferably, c satisfies the equation $0.01 \leq c \leq 0.3$, more preferably $0.05 \leq c \leq 0.2$. As conditions for controlling c, a complete condensation rate of the alkoxy groups of the raw materials is preferably from 86% to 96%. If the rate is less than 86%, a melting point tends to be low, whereas if it exceeds 96%, a melting point tends to be too high.

Accordingly, a total of a, b, and c preferably satisfies the equation, $0.911 \leq a+b+c \leq 1.8$, more preferably $1.0 \leq a+b+c \leq 1.5$.

In the above average compositional formula (1), $R^1$ may be same or different and is a monovalent hydrocarbon group having 1 to 4 carbon atoms. Examples of $R^1$ include an alkyl group such as a methyl group, an ethyl group, an isopropyl group, and a n-butyl group; and alkenyl groups such as a vinyl group and an allyl group. A methyl group and an isopropyl group are preferred because such a raw material is easily available.

Organopolysiloxane (A) has a weight average molecular weight of from 500 to 20000, preferably from 1000 to 10000, more preferably from 2000 to 8000, reduced to polystyrene as determined by GPC. If the molecular weight is less than the afore-mentioned lower limit, such an organopolysiloxane is difficult to solidify. If the molecular weight exceeds the afore-mentioned upper limit, a viscosity is so high that flowability may be too much lower.

Component (A) can generally be represented by the combination of unit Q ($SiO_2$), unit T ($CH_3SiO_{1.5}$), and unit D ($(CH_3)_2SiO$). In this notation for component (A), a molar ratio of unit T is preferably 70 mole % or higher, desirably 75 mole % or higher, particularly 80 mole % or higher, relative to the total moles of all of the siloxane units. If the molar ratio of unit T is less than 70 mole %, overall balance among the stiffness, adhesion, and appearance may be worse. The remaining part other than unit T may be units D and Q. These units may preferably account for 30 mole % or less. A melting point tends to be higher as the amounts of units D and Q increase.

Component (A) can be obtained as a hydrolysis condensate of an organosilane represented by the following general formula (3), $$(CH_3)_n SiX_{4-n} \qquad (3)$$

wherein X is a halogen atom such as chlorine or an alkoxy group having 1 to 4 carbon atoms, and n is 1, 2, or 0. Here, X is preferably a halogen atom, particularly a chlorine atom, to obtain an organopolysiloxane in a solid state.

Examples of the silane compounds represented by the afore-mentioned formula (3) include methyltrichlorosilane, methyltrimethoxysilane, methyltriethoxysilane, dimethyldichlorosilane, dimethyldimethoxysilane, dimethyldiethoxysilane, tetrachlorosilane, tetramethoxysilane, and tetraethoxysilane.

Hydrolysis and condensation of the afore-mentioned silane compounds having a hydrolysable group can be carried out in any conventional methods, for instance, in the presence of acid catalysts such as acetic acid, hydrochloric acid, and sulfuric acids or alkali catalysts such as sodium hydroxide, potassium hydroxide, and tetramethylammonium hydroxide. For instance, when a silane which has a chlorine atom as a hydrolysable group is used, water is added to generate hydrochloric acid as a catalyst so as to attain a hydrolysis condensate with a desired molecular weight.

The amount of water to be added in the hydrolysis and condensation is typically 0.9 to 1.6 moles, preferably 1.0 to 1.3 moles, relative to total 1 mole of the hydrolysable groups, such as a chlorine atom, in the afore-mentioned silane compound having a hydrolysable group. When this amount falls within the range from 0.9 to 1.6 moles, the composition exhibits excellent workability and the cured product exhibits excellent toughness.

The afore-mentioned silane compound having a hydrolysable group is hydrolyzed generally in an organic solvent such as alcohols, ketones, esters, cellosolves and aromatic compounds. Specific examples of the preferred solvents include alcohols such as methanol, ethanol, isopropyl alcohol, isobutyl alcohol, n-butanol and 2-butanol, and aromatic compounds such as toluene and xylene. A combination of isopropyl alcohol and toluene is more preferred for better curability of the composition and toughness of the cured product.

In this case, the temperature for the hydrolysis and condensation is preferably from 10 to 120 degrees C., more preferably from 20 to 100 degrees C. When the reaction temperature falls on the afore-mentioned range, a solid hydrolysis condensate does not cause gelling and is usable in the subsequent step.

When methyltrichlorosilane is used, water and isopropyl alcohol are added to methyltrichlorosilane dissolved in toluene to cause partial hydrolysis at a reaction temperature of from −5 degrees C. to 100 degrees C. Then, water is further added in such an amount that all of the unreacted chloro residues hydrolyze, and the resulting hydrolysate reacts with each other to give a solid silicone polymer represented by the following formula (4).

$$(CH_3)_a Si(OC_3H_7)_b (OH)_c O_{(4-a-b-c)/2} \qquad (4)$$

wherein a, b, and c are as defined above.

Examples of the compound represented by the afore-mentioned average compositional formula (4) include those represented by the following formula (5) or (6), which are obtained from methyltrichlorosilane as a raw material.

$$(CH_3)_{1.0}Si(OC_3H_7)_{0.07}(OH)_{0.13}O_{1.4} \quad (5)$$

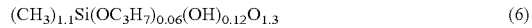

$$(CH_3)_{1.1}Si(OC_3H_7)_{0.06}(OH)_{0.12}O_{1.3} \quad (6)$$

(B) White Pigment

White pigment (B) is incorporated in order to make the cured product white for applications, such as a reflector, e.g., reflecting board, in optical semiconductor devices. As the white pigment (white coloring agent), for instance, titanium dioxide, alumina, zirconium oxide, zinc sulfide, zinc oxide, or magnesium oxide can be used alone or in combination with titanium dioxide. Among these, titanium dioxide, magnesium oxide, and alumina are preferred, and titanium dioxide is more preferred. A crystal form of the titanium dioxide may be of any type, such as rutile type, anatase type and Brookite type, and rutile type is preferred.

The white pigment preferably has an average particle diameter of from 0.05 to 10.0 μm, more preferably from 0.1 to 10.0 μm. The white pigment may be surface treated in advance, for instance, with a hydroxide of Al or Si in order to enhance its miscibility or dispersibility with resin component (A), (F), (G), or inorganic fillers (C). The average particle diameter can be determined as mass average $D_{50}$ or median diameter in particle size distribution measurement by a laser light diffraction method.

An amount of the white pigment to be added is from 3 to 200 parts by mass, preferably from 5 to 150 parts by mass, particularly from 10 to 120 parts by mass, relative to 100 parts by mass of component (A). If the amount is less than the afore-mentioned lower limit, it is sometimes difficult to attain sufficient whiteness, an initial reflectance of 70% or higher of a cured product, and a reflectance of 70% or higher after a degradation test by heating at 180 degrees C. for 24 hours. If the amount exceeds the afore-mentioned upper limit, such a problem might occur that a content of inorganic filler (C) must be reduced which is added for enhancing mechanical strength. The amount of this white pigment is preferably in a range of from 1 to 50% by mass, more preferably from 5 to 30% by mass, most preferably from 10 to 30% by mass, relative to a total amount of the silicone resin composition.

(C) Inorganic Filler

Inorganic filler (C) is a filler other than the afore-mentioned white pigment. Those which are generally blended in epoxy resin compositions can be used. Examples of the fillers include silicas such as fused silica, spherical fused silica, and crystalline silica; silicon nitride; aluminium nitride; boron nitride; and antimony trioxide. An average particle diameter and shape of these inorganic fillers are not particularly limited, but the average particle diameter is generally from 5 to 40 μm. The average particle diameter can be determined as a mass average $D_{50}$ or median diameter in particle size distribution measurement by a laser light diffraction method as described above.

Particularly, fused silica and spherical fused silica are preferred. The average particle diameter is preferably from 4 to 40 μm, more preferably from 7 to 35 for good moldability and flowability. For higher flowability of the resin composition, it is desirable to combine one in a fine particle size zone with the average particle size of 3 μm or less, one in a medium particle size zone with the average particle size of 4 to 8 μm, and one in a coarse zone with the average particle size of 10 to 40 μm. Especially in a case where a composition is used to form a pre-molded package or used as underfills having a narrow part, particularly desirable is an inorganic filler whose average particle diameter is one half of the thickness of the aforesaid narrow part.

The afore-mentioned inorganic filler may be surface treated with a coupling agent such as a silane coupling agent and a titanate coupling agent, for higher bond strength between the resin and the inorganic filler.

As the afore-mentioned coupling agents, use may preferably be made of epoxy-functional alkoxysilanes such as gamma-glycidoxypropyltrimethoxysilane, gamma-glycidoxypropylmethyldiethoxysilane, and beta-(3,4-epoxycyclohexyl)ethyltrimethoxysilane; amino-functional alkoxysilanes such as N-beta-(amino ethyl)-gamma-aminopropyltrimethoxysilane, gamma-aminopropyltriethoxysilane, and N-phenyl-gamma-aminopropyltrimethoxysilane; and mercapto-funcational alkoxysilane such as gamma-mercaptopropyltrimethoxysilane. The amount of the coupling agent for the surface treatment and a method of the surface treatment are not restricted to any particular ones.

An amount of the inorganic filler to be blended is preferably from 400 to 1000 parts by mass, particularly from 600 to 950 parts by mass, relative to 100 parts by mass of component (A). If the amount is less than the afore-mentioned lower limit, the desired linear expansion coefficient may not be attained. If the amount exceeds the afore-mentioned upper limit, a mold may not be fully filled due to the increased viscosity, or flexibility may be lost and, therefore, defects such as detachment in an element may occur. A total amount of the inorganic filler and the white pigment is preferably from 70 to 93% by mass, particularly from 75 to 91% by mass, relative to the total mass of the silicone resin composition.

(D) Condensation Catalyst

Condensation catalyst (D) is for curing the afore-mentioned component (A) and selected, considering, for instance, storage stability of component (A) and desired stiffness. Examples of the condensation catalysts include basic compounds such as trimethylbenzylammonium hydroxide, tetramethylammonium hydroxide, n-hexylamine, tributylamine, diazabicycloundecene (DBU) and dicyandiamide; metal-containing compounds such as tetraisopropyl titanate, tetrabutyl titanate, titanium acetylacetonate, aluminum triisobutoxide, aluminum triisopropoxide, zirconium tetra (acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis(ethylacetoacetate)titanium, and diisopropoxybis(ethylacetoacetate)titanium. Among these, zinc octylate, zinc bezoate, zinc p-tert-butylbenzoate, zinc laurate, zinc stearate, aluminium phosphate, and alminium triisopropoxide, particularly zinc benzote and organic titanium chelates are preferred.

The amount of the curing catalyst to be blended is from 0.01 to 10 parts by mass, preferably from 0.1 to 6 parts by mass, relative to 100 parts by mass of (A). Within the afore-mentioned range, curing is good and storage stability of the composition is also good.

(E) Epoxy Resin

Epoxy resin (E) is an adhesion coagent and selected, considering heat resistance and light resistance. Examples of the epoxy resins include bisphenol A epoxy resins; bisphenol F epoxy resins; biphenol epoxy resins such as, 3,3',5,5'-tetramethyl-4,4'-biphenol epoxy resin and 4,4'-biphenol epoxy resin; phenol novolac epoxy resins; cresol novolac epoxy resins; bisphenol A novolac epoxy resins; naphthalene diol epoxy resins; trisphenylolmethane epoxy resins; epoxy resins which are derivatives of isocyanuric acid; tetrakis phenylolethane epoxy resins; and phenoldicyclopentadiene novlac epoxy resins with their aromatic ring being hydrogenated. Among these, particularly, the epoxy resins which are derivatives of isocyanuric acid are most preferred for better heat resistance and light resistance. The amount of component (E) is preferably from 0.5 to 10 parts by mass, more preferably from 1.0 to 5 parts by mass, relative to 100 parts by mass of component (A).

(F) Organopolysiloxane

Component (F) is an organopolysiloxane which comprises unit $R_2SiO$ and unit $RSiO_{1.5}$, wherein R may be same or different and a group selected from the group consisting of a hydroxyl group, a methyl group, an ethyl group, a propyl group, a cyclohexyl group, a phenyl group, a vinyl group and an allyl group, wherein at least a part of the afore-mentioned unit $R_2SiO$ repeats itself in series and the number of the repetition is 5 to 100, and wherein 0.5 to 10 mole % of the siloxane units comprising unit $R_2SiO$ and unit $RSiO_{1.5}$ has a silanol group.

The structure where at least a part of the afore-mentioned unit $R_2SiO$ repeats itself in series and the number of the repetition is 5 to 100 means that the structure has a linear diorganopolysiloxane moiety which is represented by the following formula (7).

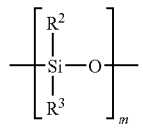

(7)

wherein $R^2$ and $R^3$ are, independently of each other, selected from the group consisting of an alkyl group having 1 to 3 carbon atoms, a cyclohexyl group, a vinyl group, a phenyl group and an allyl group, preferably a methyl group and a phenyl group. m is an integer of from 5 to 100, preferably from 8 to 50, more preferably 10 to 30. If m is less than the afore-mentioned lower limit, the cured product is poor in flexibility, i.e., crack resistance, and warpage of a device may occur. Meanwhile, if m exceeds the aforementioned upper limit, the viscosity increases and the composition tends not to melt when a composition is prepared.

In a molecule of component (F), unit $R_2SiO$ makes the polymer molecule extend linear and unit $RSiO_{1.5}$ makes the polymer molecule branched or networked in three dimensions.

Component (F) comprises unit D ($R_2SiO$), unit M ($R_3SiO_{0.5}$), or unit T ($RSiO_{1.5}$). The molar ratio thereof is preferably 90 to 24:75 to 0:50 to 1, particularly 70 to 28:70 to 20:10 to 2 for good properties of the cured product, provided that the total is 100. Here, R is the group as defined above. Component (F) may comprise unit Q ($SiO_2$).

The weight average molecular weight of component (F), reduced to polystyrene, determined by gel permeation chromatography (GPC), is preferably from 3,000 to 1,000,000, more preferably from 10,000 to 100,000. When the molecular weight is within the afore-mentioned range, the polymer is solid or a semi-solid and, therefore, is suitable for workability and curability.

Component (F) can be prepared by combining compounds which will constitute the afore-mentioned units in such a ratio that a desired mole ratio among the units is obtained in the resulting polymer, and carrying out hydrolysis and condensation in the presence of, for instance, an acid.

Examples of the raw materials for unit $RSiO_{1.5}$ include chlorosilanes such as $MeSiCl_3$, $EtSiCl_3$, $PhSiCl_3$, propyltrichlorosilane, and cyclohexyltrichlorosilane; and alkoxysilanes corresponding to the afore-mentioned chlorosilanes, such as methoxysilanes.

Examples of the raw materials for unit $R^2$, $R^3SiO$ represented by the afore-mentioned formula (7) include

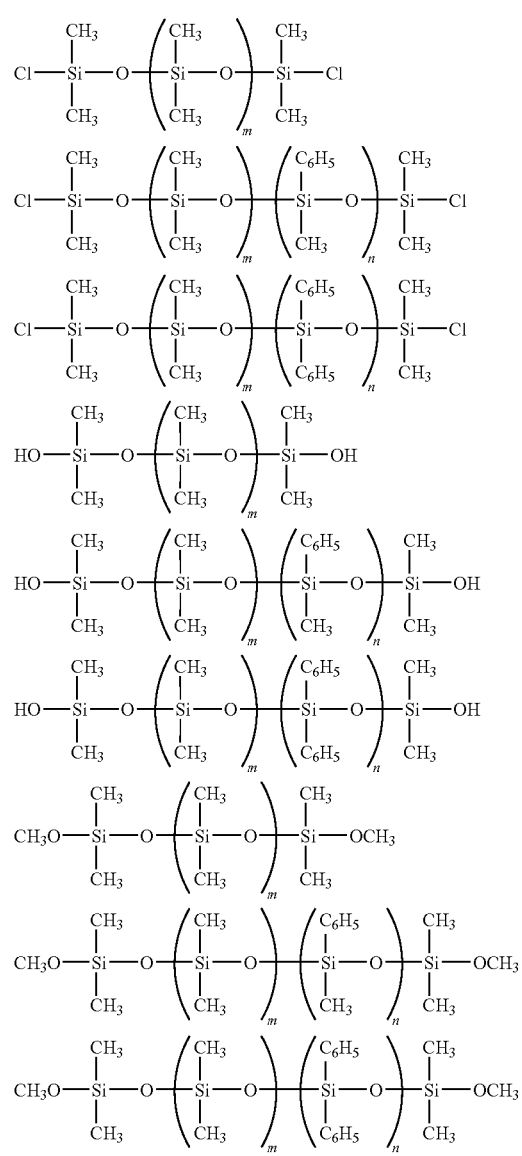

wherein m is the number of from 5-100 on average, n is the number of from 0 to 100 on average, provided that a total of m and n is the number of from 5 to 100 on average.

Examples of the raw materials for unit M and unit D include chlorosilanes such as $Me_2PhSiCl$, $Me_2ViSiCl$, $MePhSiCl_2$, $MeViSiCl_2$, $Ph_2MeSiCl$, $Ph_2ViSiCl$, and $PhViSiCl_2$; and alkoxysilanes corresponding to the afore-mentioned chlorosilanes such as methoxysilanes, wherein Me represents a methyl group; Et, an ethyl group; Ph, a phenyl group, and Vi, a vinyl group.

Component (F) can be obtained by combining the afore-mentioned raw materials in a particular mole ratio, and being reacted for instance, as follows. 100 Parts by mass of phenyl-methyldichlorosilane, 2100 parts by mass of phenyltrichlorosilane, 2400 parts by mass of a silicone oil having 21 Si atoms and chlorodimethyl groups on both ends, and 3000 parts by mass of toluene are mixed. Then, the mixture of the silanes is added dropwise to 11000 parts by mass of water, and hydrolyzed at a temperature of from 30 to 50 degrees C. for 1 hour. After aged at 50 degrees C. for 1 hour, water is added for washing and, subsequently, the organic phase is subjected to azeotropic dehydration, filtration, and strip under reduced pressure.

Siloxane units having a silanol group may be incorporated in the afore-mentioned hydrolysis and condensation step. Organopolysiloxane (F) preferably comprises the siloxane unit having a silanol group generally in a content of from 0.5 to 10 mole %, preferably from 1 to 5 mole %, relative to the total moles of all of the siloxane units. Examples of the afore-mentioned siloxane unit having a silanol group include unit $R(HO)SiO$, unit $R(HO)_2SiO_{0.5}$, and unit $R_2(HO)SiO_{0.5}$, wherein R is not a hydroxyl group. Because component (F), organopolysiloxane, has a silanol group, it reacts with component (A), curable organopolysiloxane.

The organopolysiloxane represented by the afore-mentioned general formula for component (F) is represented by the following average compositional formula.

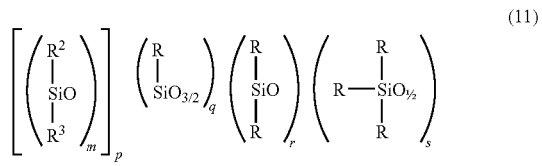

(11)

In formula (11), R, $R^2$, $R^3$ and m are as defined above. A part of R may be a hydroxyl group and another part may be an alkoxy group having 1 to 6 carbon atoms. p is 0.01 to 0.2, preferably 0.02 to 0.15; q is 0.6 to 0.95, preferably 0.7 to 0.90; r is 0 to 0.3, preferably 0 to 0.2; and s is 0 to 0.2, preferably 0 to 0.1, provided that the total is 1.

The amount of component (F) to be blended is preferably from 2 to 50 parts by mass, more preferably from 3 to 30 parts by mass, relative to 100 parts by mass of component (A). If the amount is less than the afore-mentioned lower limit, the effect of improving continuous moldability is less and the low warpage cannot be attained. If the amount is more than the afore-mentioned upper limit, the viscosity of the composition is so high that molding may be difficult.

(G) Linear Diorganopolysiloxane

Component (G) is represented by the following formula (2) and characterized in that it has methoxy groups on ends and a linear diorganopolysiloxane moiety. The amount of component (G) to be blended is preferably 2 to 50 parts by mass, and more preferably 3 to 40 parts by mass, relative to 100 parts by mass of component (A). When the amount is less than the afore-mentioned lower limit, improvement in adhesion is less and, therefore, high reliability cannot be attained. When the amount is higher than the afore-mentioned upper limit, the viscosity of the composition becomes higher, which may make molding difficult.

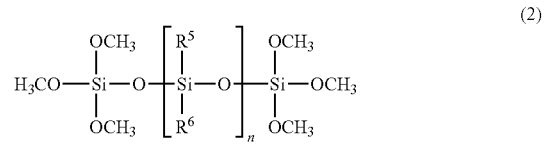

(2)

wherein $R^5$ and $R^6$ are, independently of each other, selected from the group consisting of an alkyl group having 1 to 3 carbon atoms, a cyclohexyl group, a vinyl group, a phenyl group and an allyl group, and wherein n is an integer of from 800 to 1200, preferably from 850 to 1150, more preferably from 900 to 1000. If n is less than the afore-mentioned lower limit, flexibility, i.e., crack resistance, of the cured product is insufficient to pass a temperature cycle test. If n exceeds the afore-mentioned upper limit, mechanical strength tends to lower.

Other Additives

The present silicone resin composition may further comprise various kinds of additives, if needed. For instance, in order to improve the preprerties of the resin, the present composition may comprise mercapto-functional alkoxy silanes such as gamma-mercaptopropyltrimethoxysilane; coupling agents such as gamma-glycidoxypropyltrimethoxysilane, gamma-glycidoxypropylmethyldiethoxysilane, and beta-(3,4-epoxycyclohexyl)ethyl trimethoxysilane; additives such as whiskers, silicone powder, thermoplastic resins, thermoplastic elastomers, and organic synthetic rubber; internal releasing agents such as esters of aliphatic acids, esters of glyceric acid, zinc stearate, and calcium stearate; and antioxidants of phenol type, phosphorus type, and sulfur type, in such an amount that the effects of the present invention are not damaged. The internal releasing agents such as esters of aliphatic acids, esters of glyceric acid, zinc stearate, and calcium stearate are preferably added. It should be noted that the present composition shows less discoloration by light, even without any antioxidant, compared to conventional thermosetting silicone resin compositions.

The present composition can be prepared by blending the silicone resin, the white pigment, the inorganic filler, the curing catalyst, and optional other additives in a predetermined ratio, stirring the resulting mixture sufficiently with, for instance, a mixer, which mixture is then melt mixed by, for instance, hot rolls, a kneader or an extruder, cooled to solidify, and pulverized into a suitable size to obtain the silicone resin composition for molding.

The silicone resin composition thus obtained is particularly useful as an encapsulating agent for optical semiconductor devices, specifically LED cases, and photo couplers. FIG. 1 shows a cross section of an example of an optical semiconductor device. In FIG. 1, optical semiconductor element 1, such as an LED, is die bonded to lead frame 2 and further wire bonded via bonding wire 3 to lead frame 2'. The space between these semiconductor elements is filled with transparent encapsulating resin 4. In the example illustrated in FIG. 1, a cured product of the present silicone resin composition is used to prepare white reflector 5. Numeral 6 indicates a lens.

The reflector thus obtained initially has a light reflectance at a wavelength of 450 nm of 70% or higher, particularly 80% or higher, more particularly 85% or higher. After a degradation test at 180 degrees C. for 24 hours, the reflector has a reflectance of 70% or higher, particularly 80% or higher, more particularly 85% or higher. If the reflectance after the degradation test is less than 70%, the durability as a reflector for an LED semiconductor element is short.

As the most common molding method of the reflector, mention is made of transfer molding and compression molding. The transfer molding is carried out using a transfer molding machine, preferably at a molding pressure of 5 to 20 N/mm² at a molding temperature of 120 to 190 degrees C. for a molding time of 30 to 500 seconds, particularly at a molding temperature of 150 to 185 degrees C. for a molding time of 30 to 180 seconds. In the compression molding, molding is carried out using a compression molding machine, preferably at a molding temperature of 120 to 190 degrees C. for a molding time of 30 to 600 seconds, particularly at a temperature of 130 to 160 degrees C. for 120 to 300 seconds. In both of the molding methods, post curing may be carried out at a temperature of 150 to 185 degrees C. for 2 to 20 hours.

The silicone resin composition of the present invention thus obtained has good moldability and heat and light resistances, particularly against ultraviolet ray and, therefore, is suitable for a pre-molded package for white, blue, or, further, ultraviolet LED as well as for a packaging material for solar cells.

Further, the present invention encompasses a pre-molded package which is prepared by integrally encapsulating, with the present composition, a metal substrate or an organic substrate of matrix array type with a lead part and a pad part thereon, while leaving a position for an LED element to be molded open. The present composition can also be used for encapsulating general purpose semiconductors or various modules to be installed in vehicles.

EXAMPLES

The present invention will be explained more in detail in the following Examples and Comparative Examples. However, the present invention shall not be limited to the Examples.

The raw materials used in the Examples and the Comparative Examples are as follows.

Synthesis Example 1

Organopolysiloxane (A)

To a one-litter flask were added 100 grams of methyltrichlorosilane and 200 grams of toluene. To the resulting mixture, was added dropwise a mixture of 8 grams of water and 60 grams of isopropyl alcohol over 5 to 20 hours while keeping the inner temperature at −5 to 0 degrees C. by cooling the flask in an ice bath. Then, the mixture was heated at a refluxing temperature for 20 minutes with stirring, and cooled to room temperature, to which 12 grams of water were added dropwise at a temperature below 30 degrees C. over 30 minutes and the mixture was stirred for 20 minutes. Further, 25 grams of water were added dropwise and stirred at a temperature of 40 to 45 degrees C. for 60 minutes. Then, 200 grams of water were added and an organic phase was separated. The organic phase was washed until the phase became neutral and then subjected to azeotropic dehydration, filtration, and strip under reduced pressure to obtain 36.0 grams of a colorless and transparent solid (melting point, 76 degrees C.), organopolysiloxane (A) represented by the following formula (8).

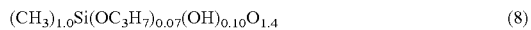

$$(CH_3)_{1.0}Si(OC_3H_7)_{0.07}(OH)_{0.10}O_{1.4} \quad (8)$$

(B) White Pigment

White pigment: titanium dioxide (rutile type), R-45M (ex Sakai Chemical Industry Co., Ltd.), average particle diameter of 0.29 μm (C) Inorganic Filler Spherical fused silica, MSR-4500TN (ex Tatsumori Co., Ltd), average particle diameter of 45 μm Spherical silica, SO 25 R (ex Admatechs Co., Ltd), average particle diameter of 0.5 μm (D) Curing Catalyst Zinc benzoate, ex Wako Pure Chemical Industries Ltd.

(E) Isocyanuric Acid Epoxy Compound

Triglycidyl isocyanurate, TEPIC, ex Nissan Chemical Industries, Ltd.

Synthesis Example 2

Organopolysiloxane (F)

5.4 Grams (0.03 mole) of phenylmethyldichlorosilane, 114 grams (0.539 mole) of phenyltrichlorosilane, 100 grams (0.066 mole) of a silicone oil having 20 Si atoms and chlorodimethyl groups on both ends and represented by Cl(Me)₂SiO(Me₂SiO)ₙSi(Me)₂Cl wherein n is 18 on average, 3000 grams of toluene were mixed, added dropwise to 11000 grams of water, and hydrolyzed at a temperature of 30 to 50 degrees C. for 1 hour. Then, the mixture was aged at 50 degrees C. for 1 hour, to which water was added for washing. Then, the organic phase was subjected to azeotropic dehydration, filtration, and strip under reduced pressure to obtain colorless and transparent organopolysiloxane (F) which had a melt viscosity of 5 Pa·s at 150 degrees C. and is represented by the following formula (9). The content of the silanol group was 3 mole %.

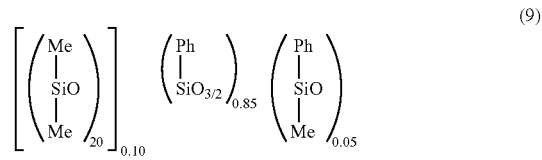

(9)

(G) Linear Diorganopolysiloxane

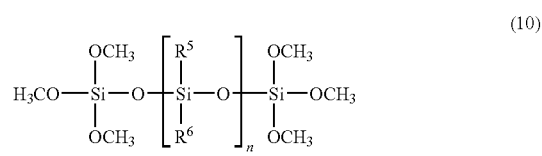

(10)

n=900 to 1000, ex Shin-Etsu Chemical Co., Ltd.

Additives (H) Silane coupling agent: KBM803, ex Shin-Etsu Chemical Co., Ltd.

(I) Wax: Calcium stearate, ex Wako Pure Chemical Industries, Ltd.

Examples 1 to 4 and Comparative Examples 1 to 4

According to the formulations shown in Table 1, organopolysiloxane (A), white pigment (B), inorganic filler (C), curing catalyst (D), epoxy resin (E), organopolysiloxane (F) and linear diorganopolysiloxane (G) were blended and mixed by rolls, cooled and pulverized to obtain white silicone resin compositions.

The following properties were determined on these compositions. The results are as shown in Table 1.

Spiral Flow Value

Using a mold according to the Epoxy Molding Materials Institute (EMMI) Standards, a spiral flow value was determined at a molding temperature of 175 degrees C. and a molding pressure of 6.9 N/mm² with a molding time of 120 seconds.

Then, a linear expansion coefficient was determined at a temperature rising rate of 5 degrees C./minute with an instrument, TMA 8140 C, ex Rigaku Corporation.

Light Reflectance

A disc, cured product of 50 mm in diameter and 3 mm in thickness, was molded in the conditions of a molding temperature of 175 degrees C., a molding pressure of 6.9 N/mm² and a molding time of 120 seconds. Immediately after the molding, the disc was left at 180 degrees C. for 24 hours, and irradiated with UV from a high-pressure mercury lamp having a peak wavelength of 365 nm and an output of 60 mW/cm for 24 hours. A light reflectance at wave lengths of 350 to 400 nm was measured using X-rite 8200, ex S. D. G. Co., Ltd.

TABLE 1

| | Component in parts by mass | | Example 1 | Example 2 | Example 3 | Example 4 | Comparative 1 | Comparative 2 | Comparative 3 | Comparative 4 |
|---|---|---|---|---|---|---|---|---|---|---|
| (A) | Organopolysiloxane | | 70 | 70 | 70 | 70 | 70 | 70 | 70 | |
| (B) | White pigment | Titanium dioxide | 160 | 160 | 160 | 160 | 160 | 160 | 160 | 160 |
| (C) | Inorganic filler | Spherical fused silica (45 μm on average) | 540 | 540 | 540 | 540 | 540 | 540 | 540 | 540 |
| | | Spherical silica (0.5 μm on average) | 60 | 60 | 60 | 60 | 60 | 60 | 60 | 60 |
| (D) | Condensation catalyst | Zinc benzoate | 1 | 1 | 1 | 1 | 1 | 1 | 1 | 1 |
| (E) | Triglycidyl isocyanurate | | 5 | 5 | 5 | 4 | | 5 | | |
| (F) | Organopolysiloxane | | 15 | 25 | 20 | 15 | 15 | 29 | 30 | |
| (G) | Linear diorganopolysiloxane | | 15 | 5 | 10 | 15 | 15 | 1 | | 100 |
| (H) | Silane coupling agent | KBM803 | 0.5 | 0.5 | 0.5 | 0.5 | 0.5 | 0.5 | 0.5 | 0.5 |
| (I) | Calcium stearate | | 1 | 1 | 1 | 1 | 1 | 1 | 1 | 1 |
| Evaluation of properties | Spiral flow | inch | 24 | 23 | 22 | 24 | 22 | 32 | 33 | 3 |
| | Melt viscosity | Pa·s | 70 | 65 | 65 | 60 | 55 | 34 | 65 | 200 |
| | Bending strength | N/mm2 | 65 | 64 | 67 | 63 | 63 | 55 | 58 | Impossible to mold |
| | Continuous moldability | Number of shots | 200< | 200< | 200< | 200< | 200< | 200< | 200< | |
| | Warpage | mm | 2< | 2< | 2< | 2< | 2< | 2< | 2< | |
| | Linear expansion coefficient | ppm/K | 16 | 16 | 16 | 16 | 16 | 15 | 15 | |
| | Adhesion | MPa | 5.3 | 5.1 | 5.1 | 5 | 2.1 | 4.9 | 1.3 | |
| | Crack resistance | | 0/8 | 0/8 | 0/8 | 0/8 | 0/8 | 5/8 | 6/8 | |
| | Light reflectance (%) | Initial | 90 | 90 | 90 | 90 | 90 | 90 | 90 | |
| | | After heated | 90 | 90 | 90 | 90 | 90 | 90 | 90 | |
| | | After irradiated | 90 | 90 | 90 | 90 | 90 | 90 | 90 | |

Adhesion Test

On an Ag-plated substance of a size of 20×20 mm, the afore-mentioned resin composition was transfer molded using a mold at 175 degrees C. and 6.9 N/mm² with a molding time of 120 seconds to form a cured resin product in a form of a frustum with a diameter of 2 mm in the upper base, a diameter of 5 mm in the bottom base, and a height of 3 mm to prepare a test piece for the adhesion test. The test piece was postcured at 180 degrees C. for 4 hours and the adhesion strength was determined according to the shear adhesion method.

Crack Resistance

An MAP type package of 35×35 mm (Cu frame) was encapsulated with a resin of 32×32×1.2 mm at 175 degrees C. and 6.9 N/mm² with a molding time of 120 seconds. The cured product was subjected to a temperature of −40 degrees C. and a temperature of 150 degrees C. in 100 cycles and the appearance was observed to visually evaluate existence of cracks (n=8).

Linear Expansion Coefficient

A cured product of 5×5×15 mm was molded in the conditions of a molding temperature of 175 degrees C., a molding pressure of 6.9 N/mm², and a molding time of 120 seconds and subjected to post curing at 180 degrees C. for 4 hours.

As seen in Table 1, the adhesion was low in Comparative Example 1, where component (E) was not contained at all. Cracks appeared after temperature cycles in Comparative Example 2 where the content of (G) was too low and Comparative Example 3 where component (G) was not contained at all. Meanwhile, in Comparative Example 4 where component (G) was only one silicone, the flowability was bad, so that the moldability was bad. Contrary to these, the Examples of the present invention showed the good adhesion and crack resistance and no decrease in light reflectance.

INDUSTRIAL APPLICABILITY OF THE INVENTION

The present resin composition is suitable for use in optical semiconductor devices, particularly reflectors.

The invention claimed is:

1. A silicone resin composition, comprising (A) 100 parts by mass of an organopolysiloxane having a weight average molecular weight of from 500 to 20000, reduced to polystyrene, and represented by the following average compositional formula (1), $$(CH_3)_a Si(OR^1)_b (OH)_c O_{(4-a-b-c)/2} \qquad (1)$$

wherein $R^1$ is a monovalent hydrocarbon group having 1 to 4 carbon atoms and a, b, and c are numbers satisfying the equations: $0.8 \leq a \leq 1.5$, $0 \leq b \leq 0.3$, $0.001 \leq c \leq 0.5$, and $0.801 \leq a+b+c < 2$,
(B) 3 to 200 parts by mass of a white pigment,
(C) 400 to 1000 parts by mass of an inorganic filler other than the afore-mentioned white pigment,
(D) 0.01 to 10 parts by mass of a condensation catalyst,
(E) 1.0 to 10 parts by mass of an epoxy resin which is a derivative of isocyanuric acid,
(F) 2 to 50 parts by mass of an organopolysiloxane comprising unit $R_2SiO$ and unit $RSiO_{1.5}$, wherein R may be same or different and is a group selected from the group consisting of a hydroxyl group, a methyl group, an ethyl group, a propyl group, a cyclohexyl group, a phenyl group, a vinyl group and an allyl group, wherein at least a part of the afore-mentioned unit $R_2SiO$ repeats itself in series and the number of the repetition is 5 to 100, and wherein 0.5 to 10 mole % of the siloxane units comprising unit $R_2SiO$ and unit $RSiO_{1.5}$ has a silanol group, and
(G) 2 to 50 parts by mass of a linear dioraganopolysiloxane represented by the following formula (2),

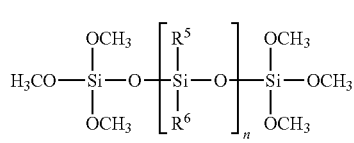
(2)

wherein $R^5$ and $R^6$ are, independently of each other, selected from the group consisting of an alkyl group having 1 to 3 carbon atoms, a cyclohexyl group, a vinyl group, a phenyl group and an allyl group and n is an integer of from 800 to 1200.

2. The silicone resin composition according to claim 1, wherein white pigment (B) is at least one selected from the group consisting of titanium dioxide, magnesium oxide and alumina with an average particle diameter of from 0.05 to 10.0 μm and is contained in a content of 1 to 50% by mass, relative to the silicone resin composition; and the total % by mass of white pigment (B) and inorganic filler (C) is 70 to 93% by mass, relative to the silicone resin composition.

3. A pre-molded package molded with the silicone resin composition according to claim 1 or 2.

* * * * *